United States Patent [19]

Black

[11] Patent Number: 4,866,402

[45] Date of Patent: Sep. 12, 1989

[54] SYSTEM TO VERIFY PHASE LOCK OF A PHASE LOCK LOOP

[75] Inventor: Michael F. Black, Garland, Tex.

[73] Assignee: Texas Instruments Incorporated, Dallas, Tex.

[21] Appl. No.: 88,911

[22] Filed: Aug. 24, 1987

[51] Int. Cl.[4] .............................................. H03L 7/08
[52] U.S. Cl. ...................................... 331/1 A; 331/25; 331/DIG. 2
[58] Field of Search ................... 331/DIG. 2, 1 A, 2 J, 331/11, 12

[56] References Cited

U.S. PATENT DOCUMENTS 4,316,154 2/1982 Krause ........................... 331/DIG. 2

OTHER PUBLICATIONS

*EXAR Databook*, EXAR Corp., Sunnyvale, Calif., Apr. 1986, pp. 1-38 to 1-52.

*Primary Examiner*—Siegfried H. Grimm
*Attorney, Agent, or Firm*—René E. Grossman; Ferdinand M. Romano; Melvin Sharp

[57] ABSTRACT

Apparatus and method for verifying the lock state or lock condition of a phase locked loop that includes a phase detector, a loop filter and a voltage controlled oscillator. The apparatus comprises a second oscillator that provides a signal of predetermined frequency to the loop filter and a second phase detector providing an output signal indicative of phase lock status. According to the method a signal of predetermined frequency is input to the loop filter and to a second phase detector. The presence of signals to the predetermined frequency is detected at the output of the loop phase detector by inputing the output from the loop phase detector to the second phase detector.

13 Claims, 5 Drawing Sheets

SYSTEM TO VERIFY PHASE LOCK OF A PHASE LOCK LOOP

BACKGROUND OF THE INVENTION

This invention refers to phase lock loop circuits and in particular to phase lock loop circuits that include an apparatus and method for indicating when a phase lock loop is in a locked position.

Phase lock loops operate at frequencies from hertz to gigahertz. Determining that a phase lock loop is actually locked to an input frequency can be difficult. Normally, expensive laboratory equipment can verify that the voltage controlled oscillator part of the phase lock loop output spectrum and operating conditions are being met.

A compact simple circuit is often required for inclusion in a phase lock loop circuit to indicate the lock state of the phase lock loop. A common technique for the lock detection is illustrated in FIG. 1. The input frequency is applied to phase lock loop at a power splitter 1 which divides the input signals to two inphase signals. A first loop phase detector 3 compares the output of a Voltage Controlled Oscillator (VOC) 5 after the output signal is divided by a quadrature power splitter 7 and based on this comparison applies a correction signal via loop filter 8 to adjust the output frequency of the VCO 5. The quadrature power splitter 7 also provides a phase quadrature signal to a quadrature detector 9 which mixes the inphase signal from the output of the power splitter 1 with the 90 degree phase quadrature output signal of the voltage controlled oscillator 5. Under a lock condition, the output of the loop phase detector 3 which is the product of the input frequency times the 0 degree phase shift output of the voltage controlled oscillator 5 is 0. However, because of the 90 degree phase shift that is provided by the quadrature phase splitter 7, the quadrature detector 9 has a DC voltage output. This voltage is filtered by a low pass filter 11 and then applied to a comparator 13 which gives an output signal indicating the phase lock loop is in a locked condition.

The phase locked loop circuit in FIG. 1 requires an additional power splitter 7 and the quadrature detector 9. At very high frequencies, such as in the microwave frequency range, the manufacturing tolerances required for these components make the embodiment of FIG. 1 difficult to reproduce and extremely expensive. Because these hybrid components must operate at the phase locked loop operating frequency, they consume valuable space when the phase locked loop circuit is implemented using microchip components and/or application technology.

SUMMARY OF THE INVENTION

An apparatus verifies the lock state or lock condition of a phase locked loop that includes a phase detector. The apparatus comprises an injection frequency oscillator that provides a frequency into the phase locked loop. A frequency detector is electrically connected to the output of the phase detector and only detects the injected frequency when the phase locked loop is in a locked state.

In one embodiment a switch is connected to selectively inject the output injection frequency from the injection frequency oscillator.

In a preferred form of the invention injection frequency detection circuitry is connected to the output of the loop phase detector. The detection circuitry includes a low frequency phase detector and a comparator which provide a signal indicative of the locked condition.

It is an object of this invention to provide a phase locked loop circuit that includes a lock indicator that can be implemented without resorting to precision high frequency components.

It is another object of the invention to provide a phase lock loop circuit having a phase lock loop detector that operates with commonly available noncritical parts.

It is yet another object of the invention to provide a phase lock loop circuit having a phase lock loop detector that operates with commonly available noncritical parts that will operate over a complete range of phase lock loop frequencies.

It is further another object of the invention to provide a phase lock loop circuit having a phase lock loop detector that can readily be integrated into a monolithic integrated circuit.

These and other advantages and objects of the invention will be apparent from a reading of the specification in conjunction with the figures in which:

DETAILED DESCRIPTION OF THE EMBODIMENTS

Figure 1:
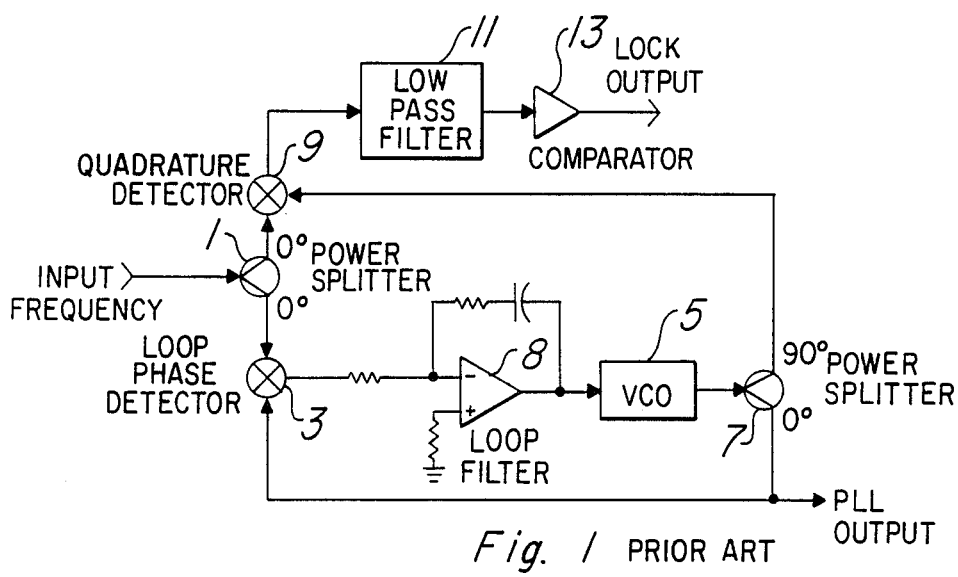
FIG. 1 is a schematic diagram of a phase locked loop including the prior art apparatus for detecting a phase lock.
Figure 2:
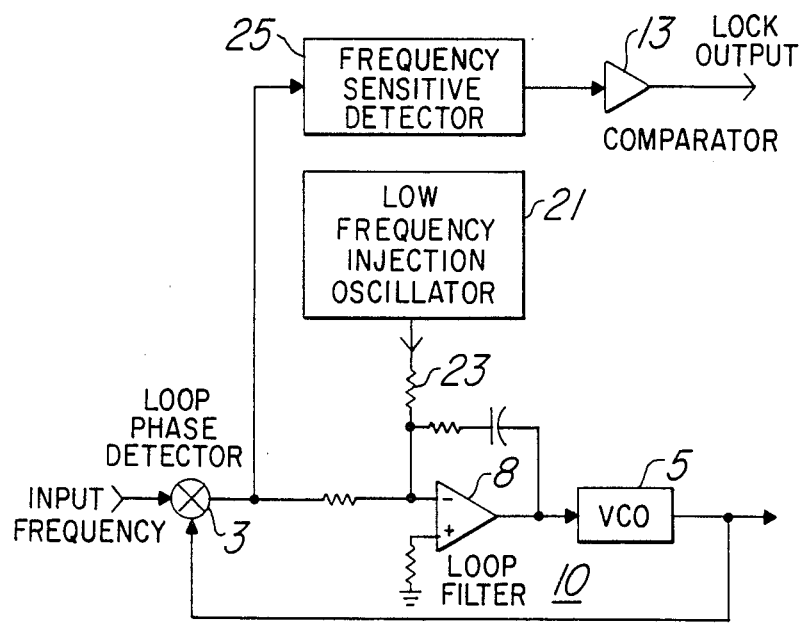
FIG. 2 is a schematic diagram indicating a phase lock loop circuit that has incorporated therein a frequency injection oscillator and lock detector according to the invention.

Referring to FIG. 2, an input frequency that a phase lock loop 10 is to lock on is applied to the phase lock loop 10 at a loop phase detector 3 where it is mixed with the output frequency of a Voltage Controlled Oscillator (VCO) 5. The output voltage from the loop phase detector 3 is applied to a loop filter 8 which passes a control voltage for controlling the VOC 5. Injection oscillator 21 provides a low frequency signal that is combined with the input to the loop filter. This injection frequency circulates through the loop filter 8, the VCO 5 and the loop phase detector 3. Under locked conditions, the resulting output of the loop phase detector is essentially the low frequency injection signal. A frequency sensitive detector 25 that is selected to detect only the low frequency signal from the injection oscillator 21 will detect this frequency and indicate it to a comparator 13. In this embodiment, the output of the frequency sensitive detector 25 is a low frequency or DC signal received by a level comparator 13. When a level comparator threshold is exceeded, an output is provided indicating locked conditions. The frequency sensitive detector 25 does not provide a detectable output to the comparator 13 under a non-locked condition.

Figure 3:
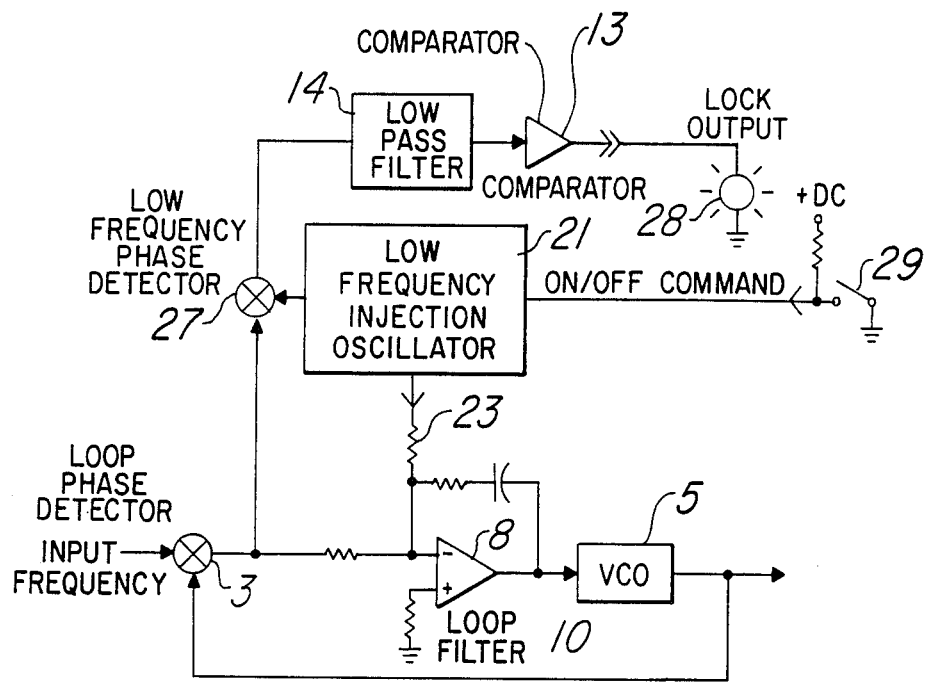
FIG. 3 is a schematic diagram of an alternate embodiment of a phase lock loop having a lock detector and a lock condition indicator.

FIG. 3 is an embodiment similar to that of FIG. 2, except that the low frequency injection oscillator only operates during the presence of an on command as provided via the switch circuit 29. The output of the low frequency injection oscillator is mixed with the output of the loop phase detector 3 by a low frequency phase detector 27. The advantage of using the low frequency phase detector 27 is its speed of response which is usually within 5 oscillator clock periods from the VCO 5. The d.c. output from the low frequency phase detector is applied to a low pass filter 14. When the threshold within the comparator is exceeded, the lamp 28 will be lit indicating a locked condition.

Figure 4:
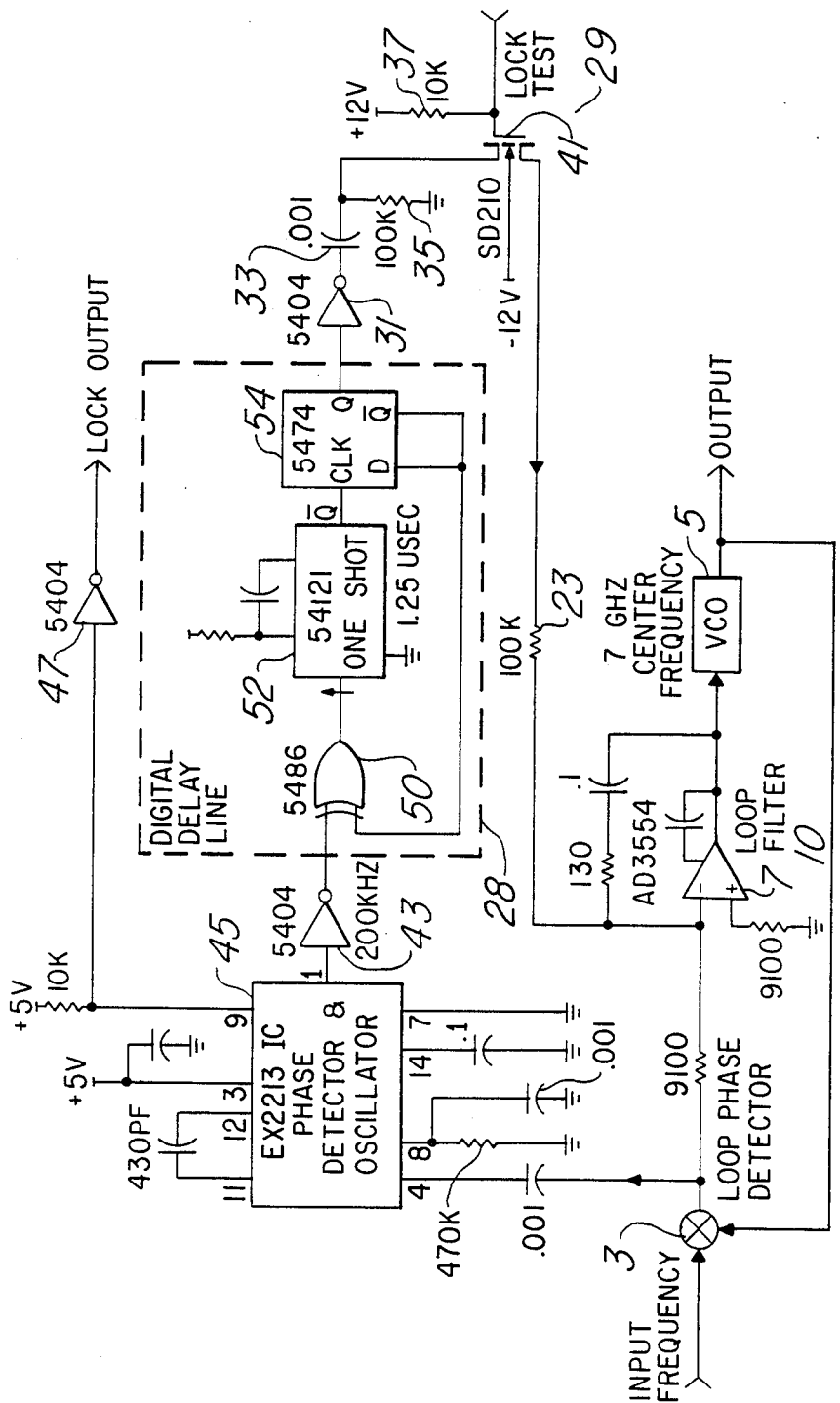
FIG. 4 is a schematic diagram of the preferred embodiment of the invention.

FIG. 4 illustrates a detailed circuit of 7 gigahertz phase locked loop which has a 200 kilohertz signal injection loop detector. The phase locked loop itself includes the loop phase detector 3, the loop filter 8 and the VCO 5 which has a 7 gigahertz center frequency. Lock test is provided by the switching arrangement 29 that includes a bias resistor 37 and a FET switch 41 which applies via resistor 23 the output from the low frequency injection oscillator 21 to the loop filter 8. A feature of the circuit in FIG. 4 is an integrated circuit 45 that is a model XR-2213 precision phase-locked loop/tone decoder manufactured by EXAR Corporation located at 750 Palomar Ave., Sunnyvale, Ca. 904086 and illustrated in "EXAR DATA BOOK", published in April 1986 on pages 1-38 through 1-52 which pages are incorporated herein by reference. The device 45 provides a 200 kilohertz clock signal output which is applied to an inverter 43. The output of the inverter 43 is applied to a digital delay line 28 that includes an exclusive OR 50, a one-shot multivibrator 52 and a D flip-flop 54. This delay line provides the clock signal through an inverter 31 and coupling capacitor 33 to an FET 41. The output of the loop phase detector 3 is applied to the phase detector and oscillator 45 which is a tone detector, and when it detects the 200 kilohertz tone a signal is provided via pin 9 of the phase detector and oscillator 45 to an inverter 47 indicating the locked condition.

A feature of the apparatus discussed in the above embodiments is that the lock detection loop is self correcting. The only frequency that the phase detector 27 will respond to is the injection frequency from the injection oscillator 21. If this frequency changes due to temperature or component tolerances changes, the phase detector 27 will still function as designed.

Figure 5:
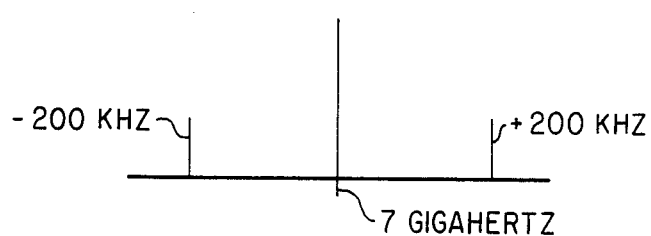
FIG. 5 is a frequency diagram showing the effects of the injection frequency on the operation of the phase lock loop.

In FIG. 5 the frequency response of the embodiment of FIG. 4 is provided. There is a center frequency of a 7 gigahertz with two side lobes each separated from the center frequency by 200 kilohertz. Thus, the injection frequency either must be located on the response diagram so as not to interfere with the operation of the system that the phase lock loop 10 is located in or it must only be used during dead or tune times to verify that the phase lock loop 10 is in the lock state.

I claim:
1. A verifiable phase lock loop system comprising:
   a phase lock loop circuit including a loop phase detector having first and second inputs for receiving signals; a loop filter having a first input for receiving an output signal from the phase detector and a second input; and a voltage controlled oscillator connected to receive an output signal from the loop filter said voltage controlled oscillator connected to provide a signal to one of the loop phase detector inputs;
   a second oscillator connected to provide a signal of predetermined frequency to the second input of the loop filter; and
   a second phase detector, sensitive to the predetermined frequency, having a first input for receiving an output signal from the loop phase detector and a second input for receiving the signal provided by the second oscillator, said second detector output signal indicative of phase lock status.

2. The system of claim 1 further comprising a comparator connected to receive output signals from said second detector and provide a logic signal indicative of phase lock.

3. The system of claim 2 further comprising a low pass filter positioned to transmit output signals from said second phase detector to said comparator.

4. The system of claim 1 formed entirely on an integrated circuit.

5. The system of claim 4 wherein the intergrated circuit is monolithic.

6. The system of claim 4 further comprising:
   a comparator connected to receive output signals from said second detector and to provide a logic signal indicative of phase lock; and
   a low pass filter positioned to transmit the output signal from said second phase detector to said comparator.

7. The system of claim 1 further comprising circuitry operatively positioned to alter the phase relationship between signals of the predetermined frequency which are received at different inputs to the second phase detector.

8. The system of claim 1 further comprising a digital delay line connected between the second oscillator and the second input of the loop filter to impart a phase lag to the signal of predetermined frequency input to the loop filter.

9. A method for verifying phase lock condition in a phase lock loop circuit including a loop phase detector having first and second signal inputs; a loop filter having a first input for receiving an output signal from the phase detector and a second input; and a voltage controlled oscillator connected to receive an output signal from the loop filter and to provide a signal to one of the loop phase detector inputs, said method comprising the steps of:
   injecting a signal of predetermined frequency to the second input of the loop filter and into a first input of a second phase detector; and
   detecting the presence of signals of the predetermined frequency at the output of the loop phase detector by inputing the output from the loop phase detector to a second input of the second phase detector.

10. The method of claim 9 further comprising the step of adjusting the phase relationship between the signal injected into the second input of the second phase detector and a signal of the predetermined frequency present at the output of the loop phase detector.

11. The method of claim 10 wherein the step of adjusting the phase relationship between signals of the predetermined frequency is accomplished with a digital delay line.

12. The method of claim 9 wherein the step of detecting the presence of signals of the predetermined frequency at the output of the loop phase detector is further accomplished by transmitting the signal provided at the output of the second phase detector through a low pass filter and into a comparator.

13. The method of claim 10 wherein the step of detecting the presence of signals of the predetermined frequency at the output of the loop phase detector is further accomplished by transmitting the signal provided at the output of the second phase detector through a low pass filter and into a comparator.

* * * * *